(12) United States Patent
Yang et al.

(10) Patent No.: US 12,180,086 B2
(45) Date of Patent: Dec. 31, 2024

(54) METHOD FOR IMPROVING CONDUCTIVITY AND BLUE LIGHT FILTERING EFFICIENCY OF TRANSPARENT CONDUCTING OXIDE (TCO)

(71) Applicant: HPSTAR (Beijing), Beijing (CN)

(72) Inventors: Wenge Yang, Beijing (CN); Xuqiang Liu, Beijing (CN); Gang Liu, Beijing (CN); Nana Li, Beijing (CN)

(73) Assignee: HPSTAR (Beijing), Beijing (CN)

( * ) Notice: Subject to any disclaimer, the term of this patent is extended or adjusted under 35 U.S.C. 154(b) by 0 days.

(21) Appl. No.: 18/468,600

(22) Filed: Sep. 15, 2023

(65) Prior Publication Data

US 2024/0092650 A1    Mar. 21, 2024

(30) Foreign Application Priority Data

Sep. 16, 2022  (CN) .......................... 202211128109.4

(51) Int. Cl.
| | | |
|---|---|---|
| *C01G 15/00* | (2006.01) | |
| *G01N 21/59* | (2006.01) | |
| *G01N 27/04* | (2006.01) | |
| *H01L 29/43* | (2006.01) | |
| *H01L 31/0224* | (2006.01) | |
| *H10K 30/82* | (2023.01) | |
| *H10K 50/805* | (2023.01) | |

(52) U.S. Cl.
CPC .............. *C01G 15/00* (2013.01); *G01N 21/59* (2013.01); *G01N 27/041* (2013.01); *C01P 2002/54* (2013.01); *C01P 2002/84* (2013.01); *C01P 2006/40* (2013.01); *C01P 2006/60* (2013.01); *H01L 29/43* (2013.01); *H01L 31/022466* (2013.01); *H10K 30/82* (2023.02); *H10K 50/805* (2023.02)

(58) Field of Classification Search
CPC ...... C01G 15/00; G01N 21/59; G01N 27/041; H01L 31/022466; H10K 30/82; C01P 2002/84
USPC .......................... 252/500, 506, 519.1, 519.12
See application file for complete search history.

(56) References Cited

U.S. PATENT DOCUMENTS

| | | | | |
|---|---|---|---|---|
| 2011/0287940 A1* | 11/2011 | Brandt | .................. | G02F 1/3556 356/73 |
| 2021/0130185 A1* | 5/2021 | Yusa | ..................... | C04B 35/645 |

FOREIGN PATENT DOCUMENTS

| | | | |
|---|---|---|---|
| CN | 112919883 A | * | 6/2021 |
| JP | 2001073123 A | | 3/2001 |
| JP | 2012126937 A | | 7/2012 |

* cited by examiner

*Primary Examiner* — Tri V Nguyen (57) ABSTRACT

The present disclosure provides a method for improving a conductivity and a blue light filtering efficiency of a transparent conducting oxide (TCO). The method includes the following steps: placing an indium oxide-based transparent conducting material (TCM) as a sample into a sample chamber of a high-pressure apparatus, and conducting a room-temperature high-pressure treatment, where the room-temperature high-pressure treatment refers to compressing the sample to a target pressure of 51 GPa from ambient pressure at room temperature and holding the target pressure for 5 min, and then conducting decompression to the ambient pressure. The conductivity is detected during the compression and the decompression, and the blue light filtering efficiency is detected separately before and after the room-temperature high-pressure treatment.

8 Claims, 9 Drawing Sheets

METHOD FOR IMPROVING CONDUCTIVITY AND BLUE LIGHT FILTERING EFFICIENCY OF TRANSPARENT CONDUCTING OXIDE (TCO)

CROSS REFERENCE TO RELATED APPLICATION

This patent application claims the benefit and priority of Chinese Patent Application No. 202211128109.4, filed with the China National Intellectual Property Administration on Sep. 16, 2022, the disclosure of which is incorporated by reference herein in its entirety as part of the present application.

TECHNICAL FIELD

The present disclosure relates to a method for improving the performances of a transparent conducting oxide (TCO) material, in particular to a method for improving a conductivity and a blue light filtering efficiency of the TCO material. The method is applicable to TCO materials of solar cells, optoelectronic devices, organic light-emitting devices, organic photovoltaic cells, and transparent field effect transistors.

BACKGROUND

Transparent conducting oxides (TCOs), which show both high conductivity and transparency, are the most commonly used transparent electrode materials in the modern semiconductor industry. The TCO is widely used in the fields such as solar cells, optoelectronic devices, organic light-emitting devices, organic photovoltaic cells, and transparent field effect transistors. Indium oxide materials doped with one of the elements such as tin, titanium, molybdenum, tungsten, zirconium, and hydrogen have become the most widely used TCO at present, and exhibit a market value as a transparent electrode exceeding 5 billion US dollars annually.

Currently, a research hotspot of TCOs is to synergistically improve the conductivity and transparency, and further increase the limit of use as a transparent electrode, thereby reducing the energy consumption applied to semiconductor devices. According to the Drude model, the magnitude of conductivity is proportional to the concentration and mobility of carriers. So far, doped indium oxide materials on the market are mainly based on a combination of oxides or oxides doped with various elements. These oxides are subjected to magnetron sputtering, laser-focused deposition and other preparation processes. Subsequently, these processes are complemented by heat treatment procedures to obtain the TCO with excellent performance. This traditional preparation process, without changing the original cubic structure of the indium oxide, increases the carrier concentration by introducing additional carriers brought by various doping elements, thereby improving the conductivity. However, excessively high carrier concentration can lead to strong light absorption, thus limiting transparency due to the carrier concentration. In addition, although the theoretical maximum carrier concentration introduced by doping is extremely high, the process of ionized impurity scattering can also impose a limit on the carrier mobility of TCO materials.

Recent reports have shown that several high-energy light-induced degradation effects in solar cells can reduce the efficiency of the TCO materials used as transparent electrodes. Blue light is a high-energy visible light with a wavelength of 400 nm to 500 nm. Excessive exposure to harmful blue light (400 nm to 460 nm) may potentially damage photoreceptor cells in the retina. Therefore, the potential hazard of blue light should be paid attention to when evaluating the transparency of TCO materials. In summary, it is a key obstacle in the material design technology to overcome the trade-off between high conductivity and high transparency in TCO materials and to consider the blue light filtering efficiency. This has also become an important topic that scientists have studied for a long time.

SUMMARY

An objective of the present disclosure is to provide a method for improving a conductivity and a blue light filtering efficiency of TCO materials. The method enables an indium oxide-based transparent conductive material (TCM) to have high conductivity and high blue light filtering efficiency as a TCO material. The method is applied to the fields of solar cells, optoelectronic devices, organic light-emitting devices, organic photovoltaic cells, and transparent field effect transistors.

The objective of the present disclosure is achieved by the following technical solutions:

The present disclosure provides a method for improving a conductivity and a blue light filtering efficiency of a TCO, including the following steps:

placing an indium oxide-based TCM as a sample into a sample chamber of a high-pressure apparatus, and conducting a room-temperature high-pressure treatment, where the room-temperature high-pressure treatment refers to compressing the sample to a target pressure of 51 GPa from ambient pressure at room temperature and holding the target pressure for 5 min, and then conducting pressure release to the ambient pressure; the conductivity is detected during the compression and decompression, and the blue light filtering efficiency is detected separately before and after the room-temperature high-pressure treatment.

In the present disclosure, the indium oxide-based TCM is selected from the group consisting of pure indium oxide and indium oxide doped with one of tin, titanium, molybdenum, tungsten, zirconium, and hydrogen; and the indium oxide-based TCM has the conductivity of greater than 10 S/m, and the average transmittance of not less than 75% in visible light at a wavelength of 460 nm to 800 nm.

In the present disclosure, the indium oxide-based TCM is a pure-phase titanium-doped indium oxide material with a cubic structure, and is prepared by a sol-gel method. A preparation method specifically includes: mixing an ethanol solution of hydrated indium nitrate ($InNO_3$ $4.5H_2O$) containing tetrabutyl titanate ($C_{16}H_{36}O_4Ti$) with an atomic percentage of Ti/(In+Ti)=2.5 at. % with an ethanol solution of citric acid ($C_6H_8O_7$) at room temperature in a volume ratio of 1:10; stirring a resulting mixed solution at 50° C. with a magnetic stirrer until a gel is formed; drying the gel in an oven at 120° C. for 3 h to remove organic matters and water; annealing a resulting dried gel at 500° C. for 9 h in an air atmosphere, and then air-cooling to room temperature to obtain the titanium-doped indium oxide material. At room temperature and ambient pressure, the material has the conductivity of 73.17 S/m measured by van der Pauw method and four-point probe configuration; by testing a transmission spectrum at a wavelength of 400 nm to 800 nm in visible light, it is calculated that the material has the blue light filtering efficiency of 44.37% at a wavelength of 400 nm to 460 nm, and an average transmittance of not less than 75% in visible light at a wavelength of 460 nm to 800 nm.

In the present disclosure, the high-pressure apparatus is a device capable of generating high pressures in a closed sample chamber, and the sample chamber is composed of a diamond anvil and a gasket. The gasket is prepared from a T301 steel sheet, and a ruby fluorescence peak is used to calibrate the pressure. A sample is placed in a sealed sample chamber after the gasket is punched. There is no pressure-transmission medium when testing the conductivity, and a short circuit position between the sample and the high-pressure apparatus is covered with an insulating substance as an insulating layer. That is: cubic boron nitride is covered as an insulating layer at the contact between the gasket and a diamond anvil surface and a side edge of the diamond anvil; 4 gold wires with a diameter of 10 μm are selected as conductivity test electrodes in contact with the titanium-doped indium oxide material; an external electrode connected to the conductivity test system is an enameled copper wire with a diameter of 170 μm. Silicone oil is selected as the pressure-transmission medium when testing the blue light filtering efficiency. An internal pressure of the sample chamber of the diamond anvil is gradually increased, and the conductivity and blue light filtering efficiency tests are conducted.

In the present disclosure, the conductivity test system is composed of a Keithley 2182A nanovoltmeter, a 6221 current source, and a 7001 converter. The conductivity detection uses the van der Pauw method and four-point probe configuration for testing under high pressures.

In the present disclosure, the blue light filtering efficiency is detected by an ultraviolet-visible absorption spectrophotometer through the following steps: testing a transmission spectrum at a wavelength of 400 nm to 800 nm in visible light, and then calculating the blue light filtering efficiency at a wavelength of 400 nm to 460 nm in blue light. That is: an average transmittance at a wavelength of 400 nm to 460 nm of blue light is subtracted from 100%, thus inversely deducing the blue light filtering efficiency of the titanium-doped indium oxide material. The average transmittance $\bar{T}$ (%) can be calculated by the following formula:

$$\bar{T} = \frac{\int_{\lambda_1}^{\lambda_2} T(\lambda)d\lambda}{\lambda_2 - \lambda_1};$$

in the formula, $T(\lambda)$ is a transmittance at a specific wavelength $\lambda$, and $\lambda_1$ and $\lambda_2$ are minimum and maximum wavelengths, respectively.

At ambient conditions, titanium-doped indium oxide, like other element-doped indium oxides, generally has a cubic bixbyite structure. Doped indium oxide of this structure has been well studied, while other possible metastable states have been seriously neglected. Considering that polymorphic forms of a crystal structure can provide different physical properties, these metastable materials can have excellent properties not possessed by thermodynamically stable phases. Therefore, the structure can be adjusted by means of room-temperature high-pressure treatment, thereby changing an electronic structure to improve the conductivity and blue light filtering efficiency. During the above room-temperature high-pressure treatment, at a stage of compression from 17.5 GPa to 40.2 GPa, the titanium-doped indium oxide undergoes a structural phase transition, which is from ambient-pressure bixbyite structure to a high-pressure corundum structure. After continuing compressing to 51 GPa, the titanium-doped indium oxide continues to maintain the high-pressure corundum structure. During decompression from 51 GPa to ambient pressure, no reversible structural phase transition is observed, and the titanium-doped indium oxide with high-pressure corundum structure remains until ambient pressure and becomes a metastable state under ambient pressure. The conductivity and blue light filtering efficiency are compared separately before and after room-temperature high-pressure treatment. It is found that the conductivity of titanium-doped indium oxide after room-temperature high-pressure treatment is increased to 6,368.85 S/m, which is 87 times higher than that before room-temperature high-pressure treatment; the blue light filtering efficiency has increased to 77.02%, which is 1.7 times higher than that before the room-temperature high-pressure treatment. Moreover, the average transmittance within a wavelength of 460 nm to 800 nm in visible light is still extremely high, exceeding 80%, indicating the extremely high transparency. This room-temperature high-pressure treatment leads to the improvement of the conductivity and high blue light filtering efficiency of TCO materials. This not only shows that pressure engineering is a clean and effective tool for customizing functional materials that cannot be realized by other methods, but also provides a new direction for advancing the development of TCO technology.

Compared with the prior art, the present disclosure has the following advantages:

1. Compared with a traditional doping process of the TCO, the room-temperature high-pressure treatment causes an irreversible phase transition of the indium oxide-based TCM from a cubic structure to a corundum structure. This can not only improve the conductivity and the blue light filtering efficiency of the indium oxide-based TCM simultaneously, but also maintain a high transparency at a wavelength of 460 nm to 800 nm in the visible light. In this way, the TCM has an average transmittance of not less than 80%, thus satisfying practical applications.

2. In the present disclosure, the room-temperature high-pressure treatment can break through a limitation of the traditional TCO technology-based doping process in terms of conductivity improvement, such that the indium oxide-based TCM has both high conductivity and blue light filtering efficiency. This TCM can be used as a TCO material and applied to the fields such as solar cells, optoelectronic devices, organic light-emitting devices, organic photovoltaic cells, and transparent field effect transistors. Due to its ability to resist electromagnetic radiation, corrosion, high temperature, and oxidation, a service capacity of this TCO material is enhanced in extreme environments with electromagnetic radiation, corrosion, high temperature, and oxidation.

DETAILED DESCRIPTION OF THE EMBODIMENTS

To better understand the present disclosure, the technical solution of the present disclosure is described in further detail below with reference to specific implementations, but the present disclosure is not limited thereto. Any modification or equivalent replacement of the technical solution of the present disclosure made without departing from the spirit and scope of the technical solution of the present disclosure should fall within the protection scope of the present disclosure.

Example 1

This example served as a comparative example. A TCM based on indium oxide was a pure-phase titanium-doped indium oxide powder prepared by a sol-gel method. A sample was compacted and placed on a glass slide to test the conductivity and blue light filtering efficiency under ambient pressure and room temperature. Test results showed that the conductivity under ambient pressure was 73.17 S/m.

Figure 1:
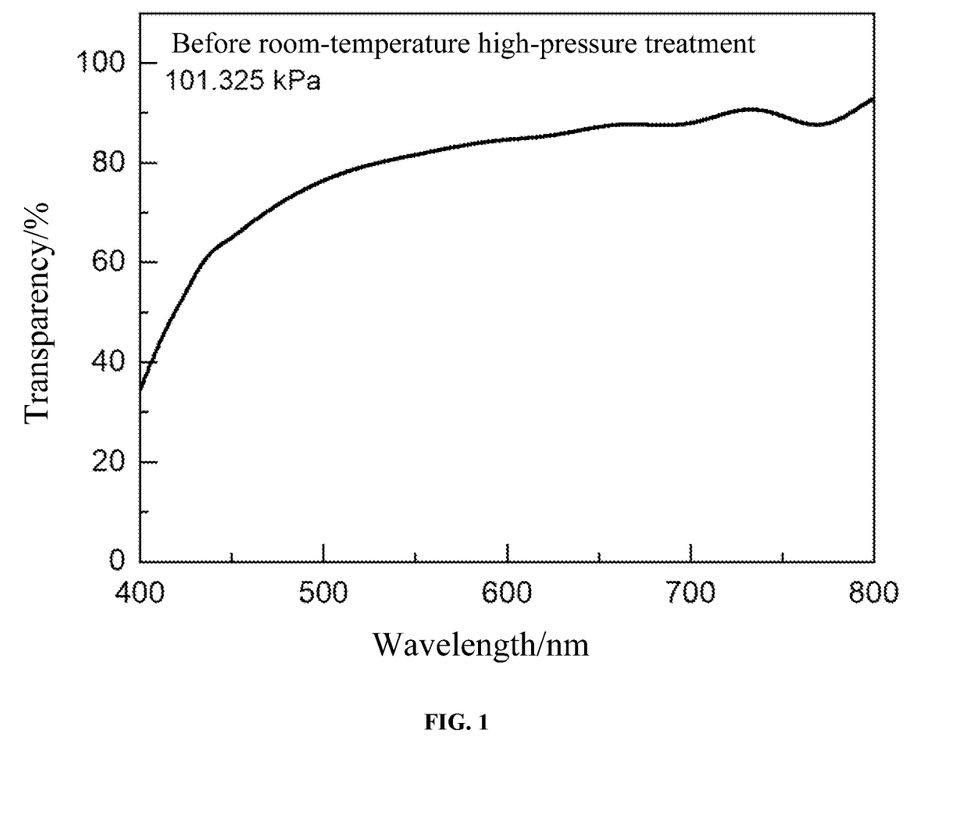
FIG. 1 shows a measurement result of a transmission spectrum of titanium-doped indium oxide in visible light (400 nm to 800 nm) under the conditions of Example 1.

At room temperature, a transmission spectrum of the titanium-doped indium oxide sample in visible light (400 nm to 800 nm) was obtained by using an ultraviolet-visible absorption spectrophotometer, as shown in FIG. 1. The results were calculated by the formula: the average transmittance at a wavelength of 400 nm to 460 nm was 55.63%; the average transmittance at a wavelength of 460 nm to 800 nm was 84.36%; and the blue light filtering efficiency at a wavelength of 400 nm to 460 nm was 44.37%.

Example 2

In this example, a same titanium-doped indium oxide powder as that in Example 1 was used. A compacted sample in Example 1 was placed in a sealed sample chamber of a diamond anvil for room-temperature high-pressure treatment using silicone oil as a pressure-transmission medium, and pressure was calibrated using a ruby fluorescence peak.

The room-temperature high-pressure treatment included: the internal pressure in the sample chamber of the diamond anvil was gradually increased from ambient pressure to 51 GPa and held for 5 min, and then released to the ambient pressure to complete the room-temperature high-pressure treatment.

Figure 2:
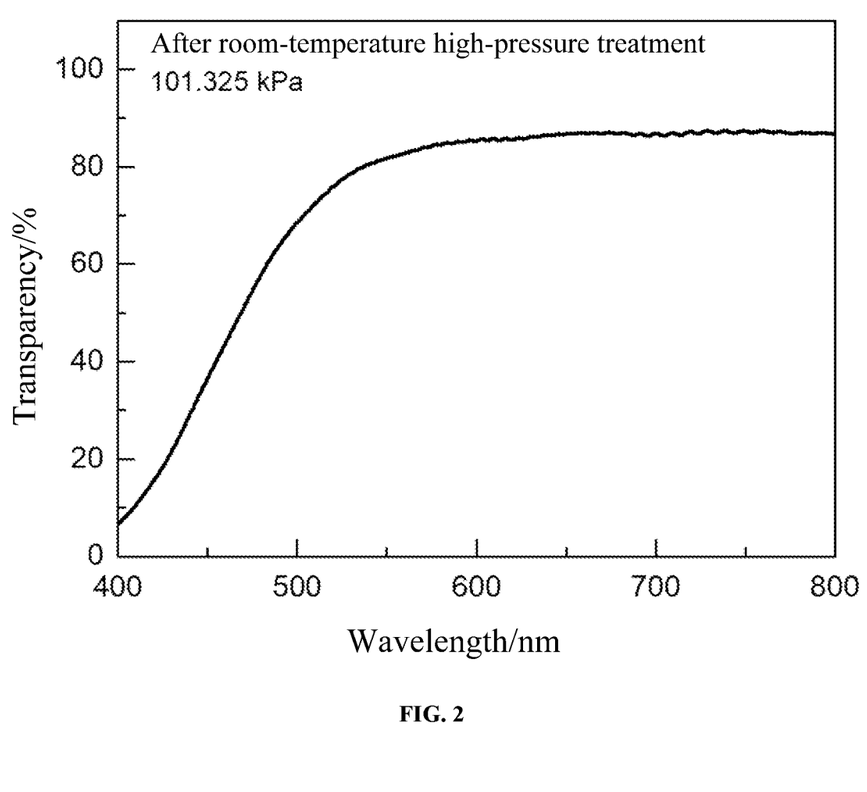
FIG. 2 shows a measurement result of a transmission spectrum of titanium-doped indium oxide in visible light (400 nm to 800 nm) under the conditions of Example 2.

At room temperature, the sample after the room-temperature high-pressure treatment was tested by using an ultraviolet-visible absorption spectrophotometer. A transmission spectrum of the sample in visible light (400 nm to 800 nm) was shown in FIG. 2. The results were calculated by the formula: the average transmittance at a wavelength of 400 nm to 460 nm was 22.98%; the average transmittance at a wavelength of 460 nm to 800 nm was 81.31%; and the blue light filtering efficiency at a wavelength of 400 nm to 460 nm was 77.02%.

Example 3

In this example, a same titanium-doped indium oxide powder as that in Example 1 was used. A sample was filled in a sealed sample chamber of a diamond anvil for room-temperature high-pressure treatment, no pressure-transmission medium was added, and pressure was calibrated using a ruby fluorescence peak. The internal pressure of the sample chamber of the diamond anvil was gradually increased from ambient pressure to 51 GPa. During the compression, multiple pressure points were taken and held for 5 min to test the conductivity of the sample, and the specific results were shown in FIG. 3.

Figure 3:
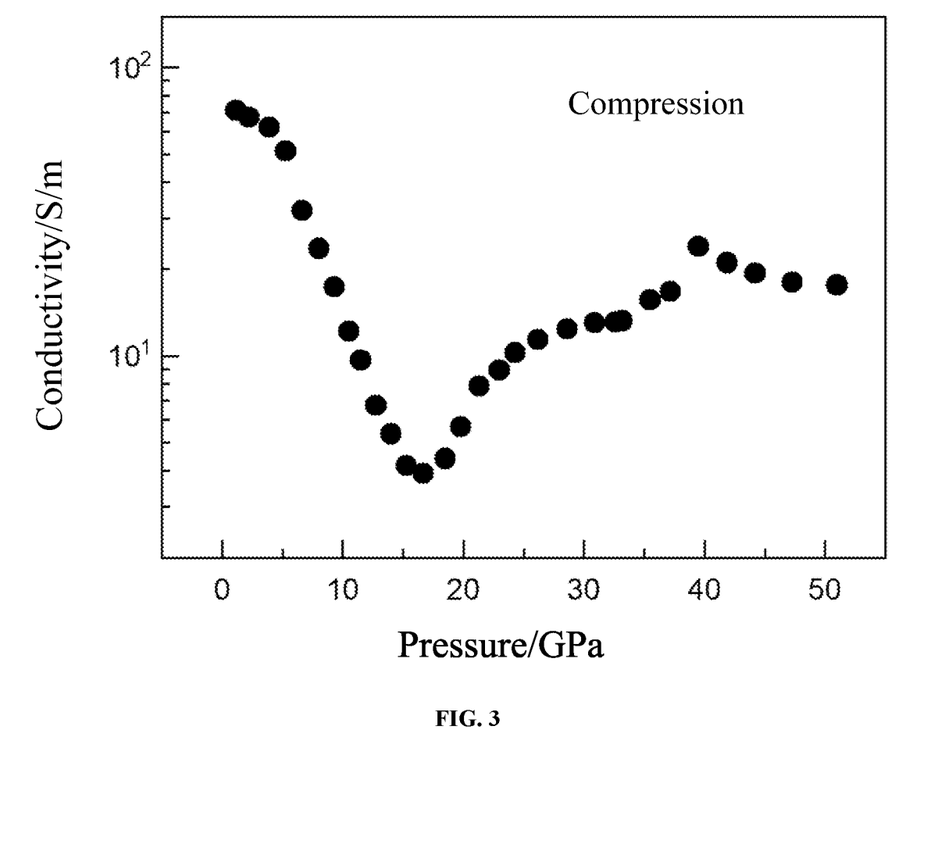
FIG. 3 shows a conductivity test result of titanium-doped indium oxide during compression under the condition of Example 3.

As shown in FIG. 3, the conductivity of the sample gradually decreased from 73.17 S/m to 4.90 S/m from ambient pressure to 16.7 GPa. As the internal pressure of the sealed sample chamber of the diamond anvil was further increased to 40 GPa, it was found that pressure-induced structural phase transition drove an increase in the sample conductivity. Subsequently, the conductivity decreased slightly during the compression from 40 GPa to 51 GPa, indicating that the pressure-induced structural phase transition was completed.

Example 4

The internal pressure of a sample chamber of a diamond anvil in Example 3 was gradually reduced from 51 GPa to ambient pressure, and multiple pressure points were taken during the decompression and held for 5 min to test the conductivity of the sample. The specific results were shown in FIG. 4.

Figure 4:
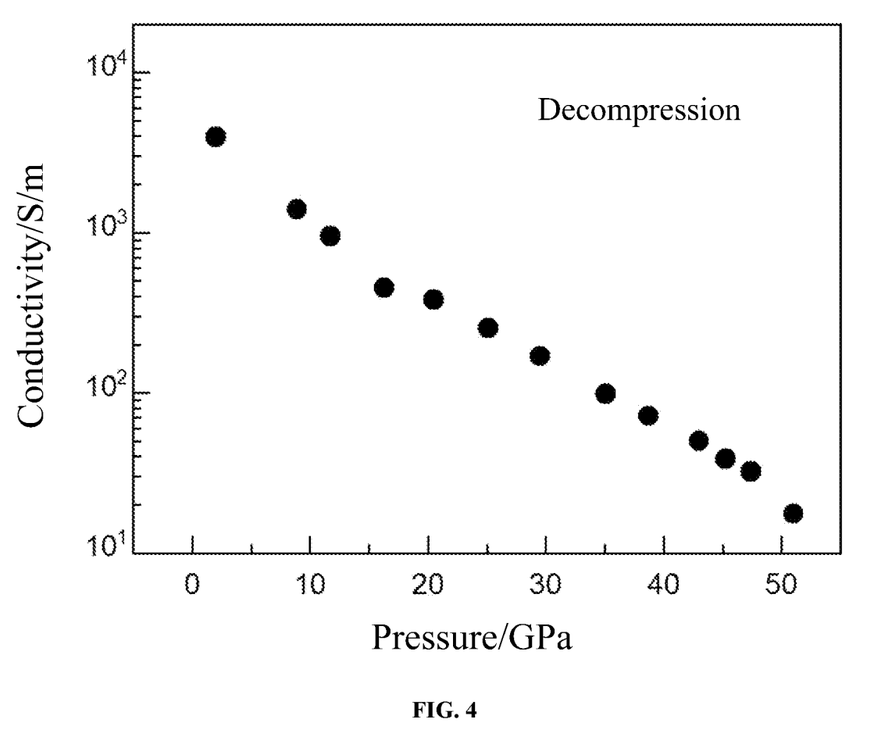
FIG. 4 shows a conductivity test result of titanium-doped indium oxide during decompression under the condition of Example 4.

As shown in FIG. 4, as the internal pressure of the sample chamber of the diamond anvil gradually decreased, the conductivity of the sample increased from 17.59 S/m at 51 GPa to 3,968.22 S/m at 2 GPa. There was no obvious turning point in the conductivity throughout the decompression, indicating that no structural phase transition occurred during the decompression. Combined with the changes in conductivity during compression, an irreversible structural phase transition occurred in the sample during the entire room-temperature high-pressure treatment, resulting in an increase in the conductivity of the sample.

Example 5

The sample after the room-temperature high-pressure treatment in Example 4 was tested at room temperature and pressure to obtain the conductivity, which was compared with the conductivity in Example 1; while the blue light filtering efficiency of the sample after room-temperature high-pressure treatment in Example 2 was also compared with the blue light filtering efficiency in Example 1. The specific results were shown in FIG. 5.

Figure 5:
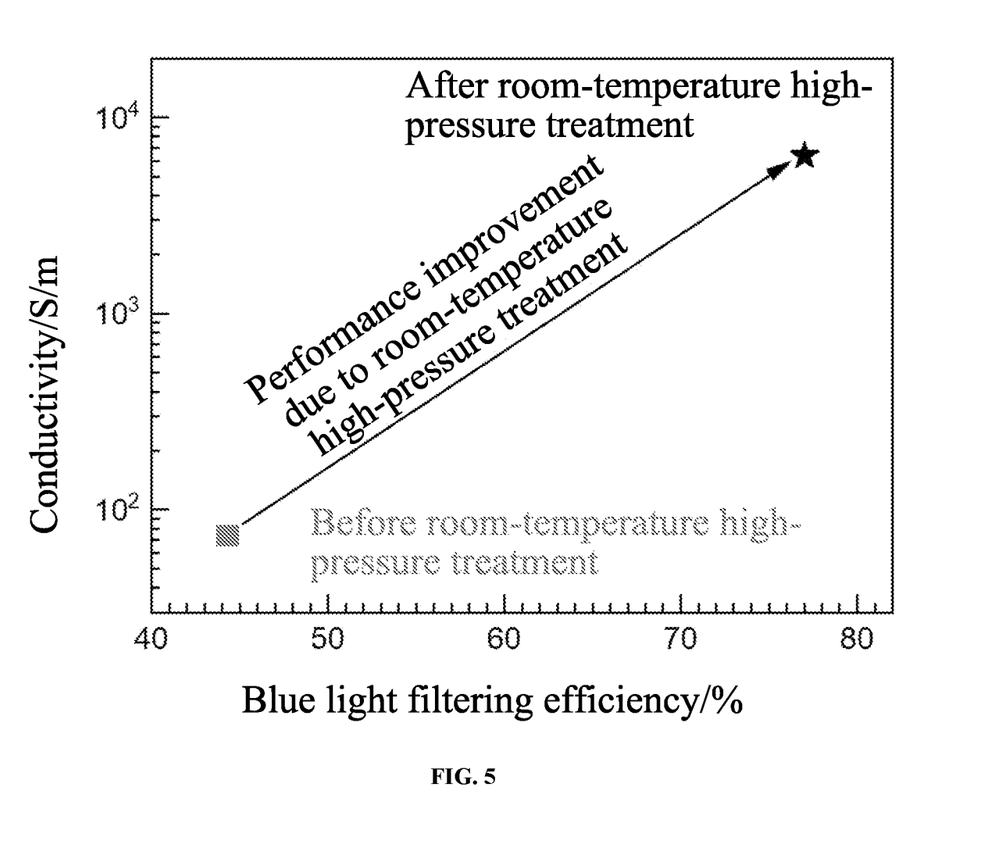
FIG. 5 shows a conductivity test result of the titanium doped indium oxide after decompression under the condition of Example 5.

As shown in FIG. 5, the conductivity before and after room-temperature high-pressure treatment increased significantly, from 73.17 S/m to 6,368.85 S/m, showing an increase by 87 times; the blue light filtering efficiency increased from 44.37% to 77.02%, showing an increase by 1.7 times. Meanwhile, the average transmittance of the sample before and after room-temperature high-pressure treatment in visible light of 460 nm to 800 nm was still extremely high, exceeding 80%, indicating that the high transparency was maintained. These results proved that the room-temperature high-pressure treatment improved the conductivity and blue light filtering efficiency of the titanium-doped indium oxide material through pressure-driven structural phase transitions, thus providing a new direction for advancing the development of TCO technology.

Example 6

This example differed from Examples 1 to 5 in that: the indium oxide-based TCM was pure indium oxide purchased from Aladdin Pharmaceutical Company, with a purity of greater than or equal to 99.99%. A sample of this material was compacted and placed on a glass slide to test the conductivity and blue light filtering efficiency under ambient pressure and room temperature. Test results showed that the conductivity under ambient pressure was 17.62 S/m.

Figure 6:
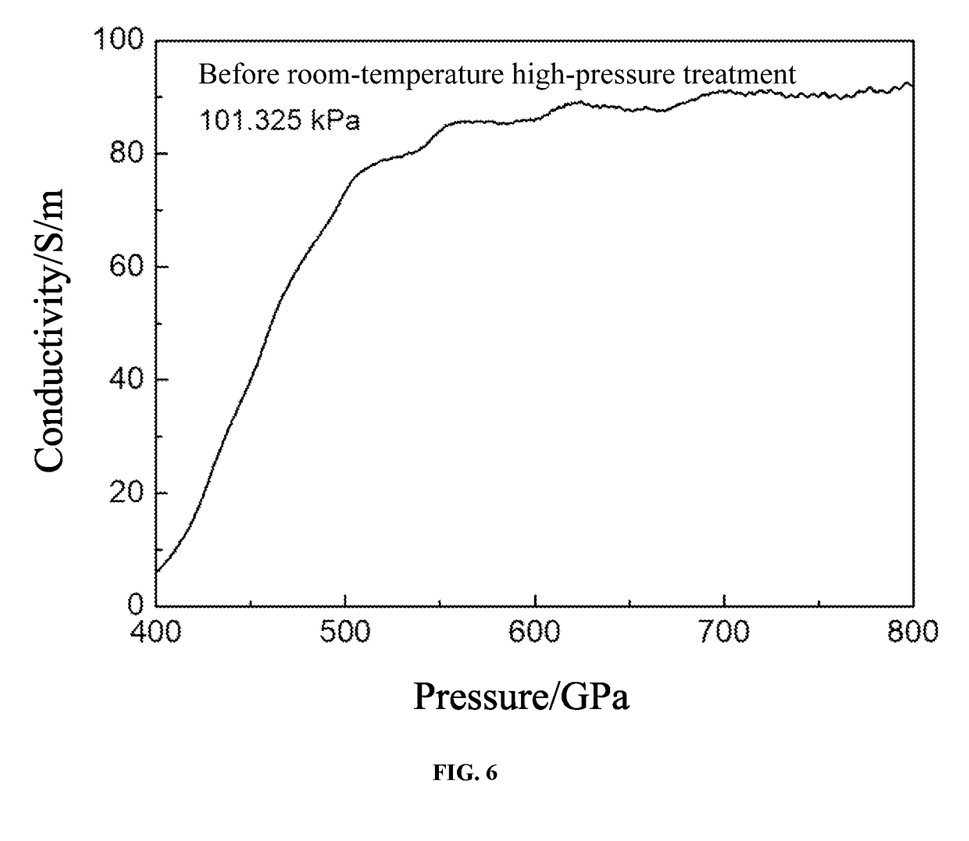
FIG. 6 shows a measurement result of a transmission spectrum of an indium oxide sample in visible light (400 nm to 800 nm) under the conditions of Example 6.

At room temperature, a transmission spectrum of the indium oxide sample in visible light (400 nm to 800 nm) was obtained by using an ultraviolet-visible absorption spectrophotometer, as shown in FIG. 6. The results were calculated by the formula: the average transmittance at a wavelength of 400 nm to 460 nm was 25.11%; the average transmittance at a wavelength of 460 nm to 800 nm was 84.19%; and the blue light filtering efficiency at a wavelength of 400 nm to 460 nm was 74.89%.

Example 7

In this example, a same indium oxide powder as that in Example 6 was used. A compacted sample in Example 6 was placed in a sealed sample chamber of a diamond anvil for room-temperature high-pressure treatment using silicone oil as a pressure-transmission medium, and a pressure was calibrated using a ruby fluorescence peak.

The room-temperature high-pressure treatment included: an internal pressure in the sample chamber of the diamond anvil was gradually increased from ambient pressure to 51 GPa and held for 5 min, and then reduced to the ambient pressure to complete the room-temperature high-pressure treatment.

Figure 7:
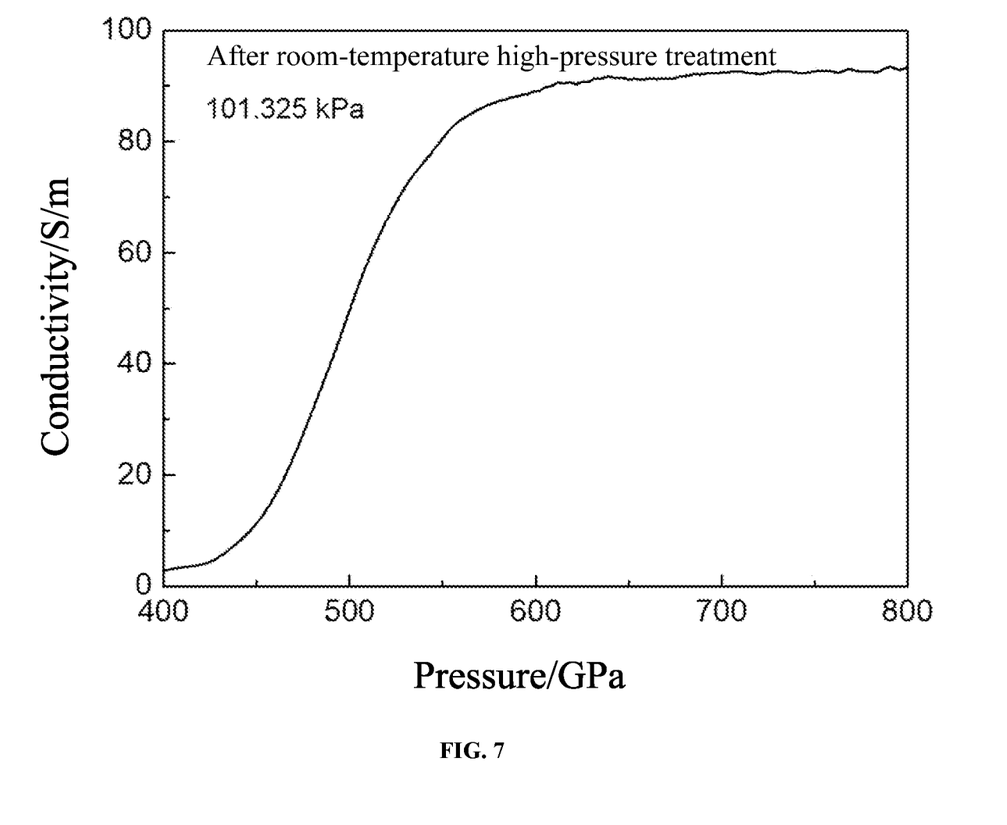
FIG. 7 shows a measurement result of a transmission spectrum of an indium oxide sample in visible light (400 nm to 800 nm) under the conditions of Example 7.

At room temperature, the sample after the room-temperature high-pressure treatment was tested by using an ultraviolet-visible absorption spectrophotometer. A transmission spectrum of the sample in visible light (400 nm to 800 nm) was shown in FIG. 7. The results were calculated by the formula: the average transmittance at a wavelength of 400 nm to 460 nm was 6.85%; the average transmittance at a wavelength of 460 nm to 800 nm was 80.48%; and the blue light filtering efficiency at a wavelength of 400 nm to 460 nm was 93.15%.

Example 8

In this example, a same indium oxide powder as that in Example 6 was used. A sample was filled in a sealed sample chamber of a diamond anvil for room-temperature high-pressure treatment, no pressure-transmission medium was added, and a pressure was calibrated using a ruby fluorescence peak. An internal pressure of the sample chamber of the diamond anvil was gradually increased from ambient pressure to 51 GPa. During the compression, multiple pressure points were taken and held for 5 min to test the conductivity of the sample, and the specific results were shown in FIG. 8.

Figure 8:
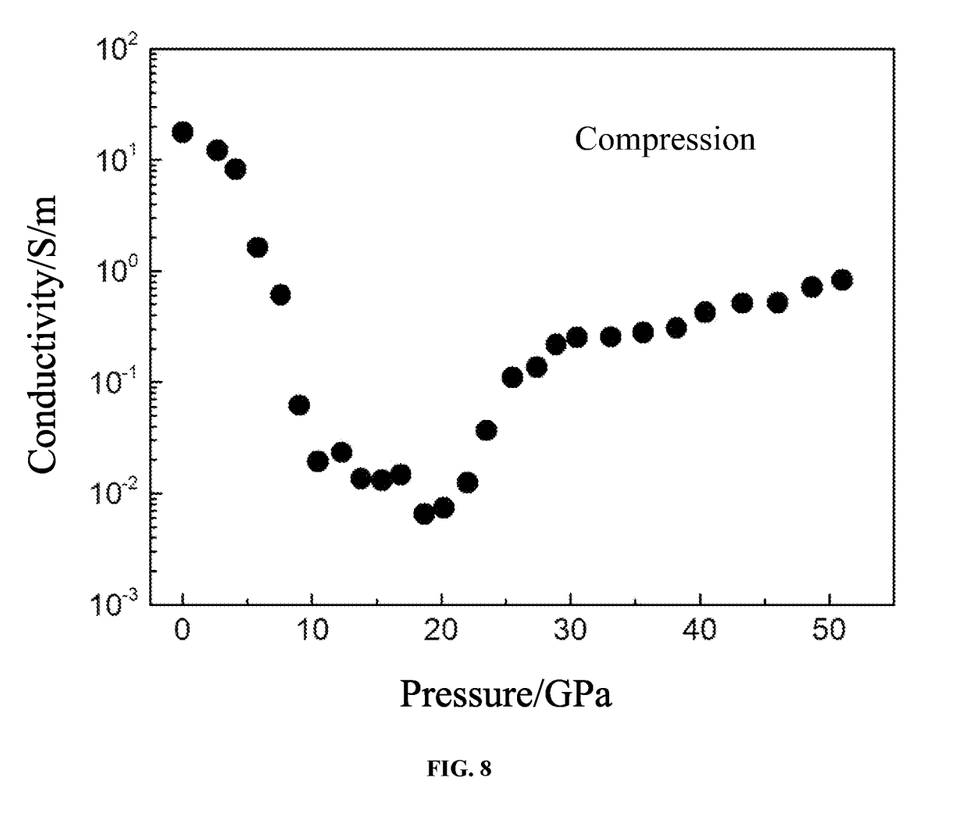
FIG. 8 shows a conductivity test result of indium oxide during compression under the condition of Example 8.

As shown in FIG. 8, the conductivity of the sample gradually decreased from 17.62 S/m to 0.007 S/m from ambient pressure to 18.7 GPa. As the internal pressure of the sealed sample chamber of the diamond anvil was further increased to 30.5 GPa, it was found that pressure-induced structural phase transition drove an increase in the sample conductivity. Subsequently, the conductivity changed steadily during the compression from 30.5 GPa to 51 GPa, indicating that the pressure-induced structural phase transition was completed.

Example 9

An internal pressure of a sample chamber of a diamond anvil in Example 8 was gradually reduced from 51 GPa to ambient pressure, and multiple pressure points were taken during the decompression and held for 5 min to test the conductivity of the sample. The specific results were shown in FIG. 9.

Figure 9:
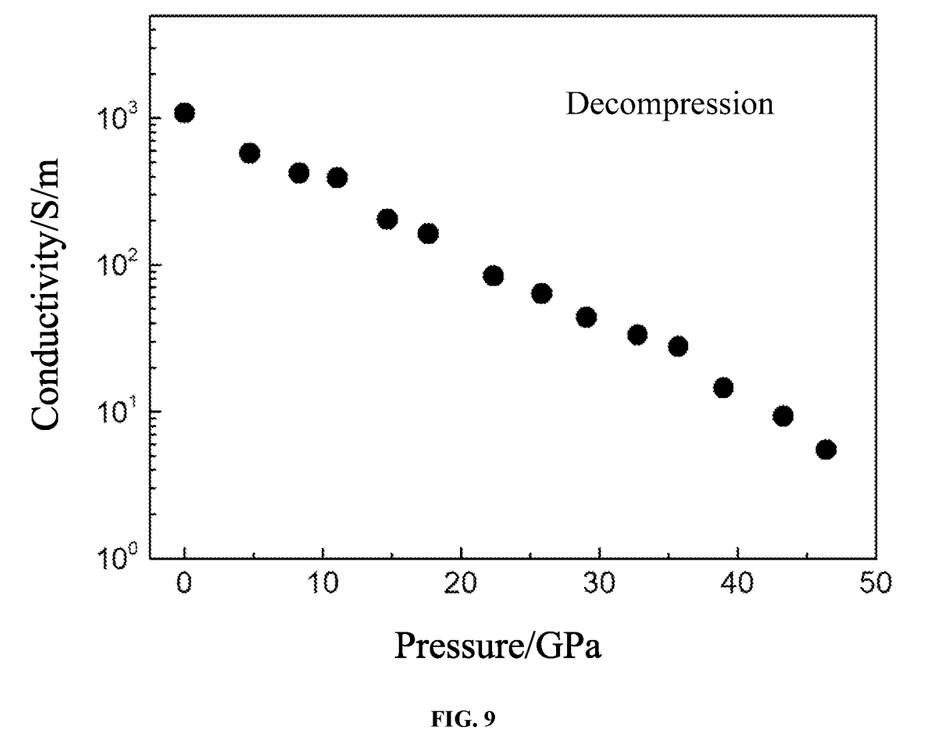
FIG. 9 shows a conductivity test result of indium oxide during decompression under the condition of Example 9.

As shown in FIG. 9, as the internal pressure of the sample chamber of the diamond anvil gradually decreased, the conductivity of the sample increased from 0.83 S/m at 51 GPa to 1,078.10 S/m at ambient pressure. There was no obvious turning point in the conductivity throughout the decompression, indicating that no structural phase transition occurred during the decompression. Combined with the changes in conductivity during compression, an irreversible structural phase transition occurred in the sample during the entire room-temperature high-pressure treatment, resulting in an increase in the conductivity of the sample.

Example 10

This example differed from Examples 1 to 9 in that: the indium oxide-based TCM was tin-doped indium oxide.

What is claimed is:

1. A method for improving a conductivity and a blue light filtering efficiency of a transparent conducting oxide (TCO), comprising the following steps:
    placing an indium oxide-based transparent conducting material (TCM) as a sample into a sample chamber of a high-pressure apparatus, and conducting a room-temperature high-pressure treatment, wherein the room-temperature high-pressure treatment refers to compressing the sample to a target pressure of 51 GPa from ambient pressure at room temperature and holding the target pressure for 5 min, and then conducting decompression to the ambient pressure; the indium oxide-based TCM is selected from the group consisting of pure indium oxide and indium oxide doped with one of tin, titanium, molybdenum, tungsten, zirconium, and hydrogen; and the indium oxide-based TCM has a conductivity of greater than 10 S/m, and an average transmittance of over 75% in visible light at a wavelength of 460 nm to 800 nm.

2. The method for improving a conductivity and a blue light filtering efficiency of a TCO according to claim 1, wherein the conductivity is detected during the compressing and the decompression, the blue light filtering efficiency is detected separately before and after the room-temperature high-pressure treatment, and the ambient pressure and the target pressure are calibrated separately by a ruby fluorescence peak.

3. The method for improving a conductivity and a blue light filtering efficiency of a TCO according to claim 1, wherein when the conductivity is detected, an insulating substance is covered as an insulating layer at a short circuit position between the sample and the high-pressure apparatus.

4. The method for improving a conductivity and a blue light filtering efficiency of a TCO according to claim 1, wherein the conductivity is detected by van der Pauw method and four-point probe configuration.

5. The method for improving a conductivity and a blue light filtering efficiency of a TCO according to claim 1, wherein the blue light filtering efficiency is detected by an ultraviolet-visible absorption spectrophotometer through the following steps: testing a transmission spectrum at a wavelength of 400 nm to 800 nm in visible light, and then calculating the blue light filtering efficiency at a wavelength of 400 nm to 460 nm in blue light.

6. The method for improving a conductivity and a blue light filtering efficiency of a TCO according to claim 2, wherein when the conductivity is detected, an insulating substance is covered as an insulating layer at a short circuit position between the sample and the high-pressure apparatus.

7. The method for improving a conductivity and a blue light filtering efficiency of a TCO according to claim 2, wherein the conductivity is detected by van der Pauw method and four-point probe configuration.

8. The method for improving a conductivity and a blue light filtering efficiency of a TCO according to claim 2, wherein the blue light filtering efficiency is detected by an ultraviolet-visible absorption spectrophotometer through the following steps: testing a transmission spectrum at a wavelength of 400 nm to 800 nm in visible light, and then calculating the blue light filtering efficiency at a wavelength of 400 nm to 460 nm in blue light.

* * * * *